United States Patent [19]

Akagawa

[11] Patent Number: 4,958,873
[45] Date of Patent: Sep. 25, 1990

[54] MULTI-DISK CLAMP END EFFECTOR

[75] Inventor: Minoru Akagawa, Fremont, Calif.

[73] Assignee: Intelmatec Corporation, Fremont, Calif.

[21] Appl. No.: 251,786

[22] Filed: Oct. 17, 1988

[51] Int. Cl.$^5$ ............................................. B66C 1/54
[52] U.S. Cl. ................................. 294/93; 294/158
[58] Field of Search ............... 294/93, 94, 96, 158, 294/119.1; 279/2 R; 221/69, 89

[56] References Cited

U.S. PATENT DOCUMENTS

| | | | |
|---|---|---|---|
| 2,701,736 | 2/1955 | Heppenstall et al. | 294/94 |
| 3,073,610 | 1/1963 | Mackinder et al. | 279/2 R |
| 4,198,066 | 4/1980 | Deprez et al. | 279/2 R |
| 4,283,082 | 8/1981 | Tracy | 294/15 |

Primary Examiner—Margaret A. Focarino
Assistant Examiner—Dean J. Kramer
Attorney, Agent, or Firm—Flehr, Hohbach, Test, Albritton & Herbert

[57] ABSTRACT

A multi-disk clamp end effector carries around a tubular member a plurality of disks with a center hole like wafers and releases them sequentially one at a time. Each disk is attached to the tubular member by means of a holder which not only supports the disk but also is pressed to the tubular member by an elastic ring. As the tubular member is gradually retracted and its front end passes the position of each holder, the contracting force of the spring disengages the holder from the disk to which it is attached and the corresponding disk is released.

9 Claims, 2 Drawing Sheets

MULTI-DISK CLAMP END EFFECTOR

BACKGROUND OF THE INVENTION

This invention relates to a multi-disk clamp end effector, or a device on which a plurality of disks with a center hole can be carried at the same time and from which these disks can be released sequentially one at a time.

Disks such as wafers upon which a very large number of electronic microcircuits and/or components are formed undergo many processes during their production. Since such wafers are not only fragile and easily damaged but also extremely sensitive to many kinds of contamination, abrasion and damage, various automated apparatus have been made available for transporting them from one processing station to another and handling them in various manners at these processing stations. For transporting a plurality of wafers to different places, or to the same place sequentially, for example, prior art wafer transfer systems are typically programmed to receive wafers one at a time, deliver one of them to its intended destination, go back to the starting position to receive another wafer and repeat this cycle of motion over again. More efficient methods of transferring disks like wafers and apparatus therefor are desirable.

SUMMARY OF THE INVENTION

It is therefore an object of the present invention to provide an apparatus with which disks like wafers can be transferred more efficiently.

It is another object of the present invention to provide an apparatus capable of carrying a plurality of disks at the same time and transferring them to their destination or destinations sequentially one at a time.

The above and other objects of the present invention are achieved by providing a multi-disk clamp end effector adapted to carry a plurality of disks with a center hole around a tubular member which retractably sticks out of a supporting structure and penetrates these disks through their center holes. When the disks are carried, say, for transportation, they are firmly secured to the outer cylindrical surface of this tubular member by means of holders, or devices which are each adapted both to be attached to the inner rim of one of the disks and to centripetally press the outer cylindrical surface of the tubular member. For sequentially releasing the disks, the tubular member is gradually retracted into the supporting structure, longitudinally sliding along its axis. Whenever a holder "loses" the tubular member on which to apply its centripetal force, the disk attached to it loses its support from the tubular member and becomes releasable. For thus moving the tubular member longitudinally, a shaft serving as a helical gear is provided and a tubular nut secured to the tubular member is mounted around it in a motion-communicating relationship such that the tubular member can be pulled in and out of the supporting structure by a rotary motion of this shaft.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE INVENTION

Figure 1:
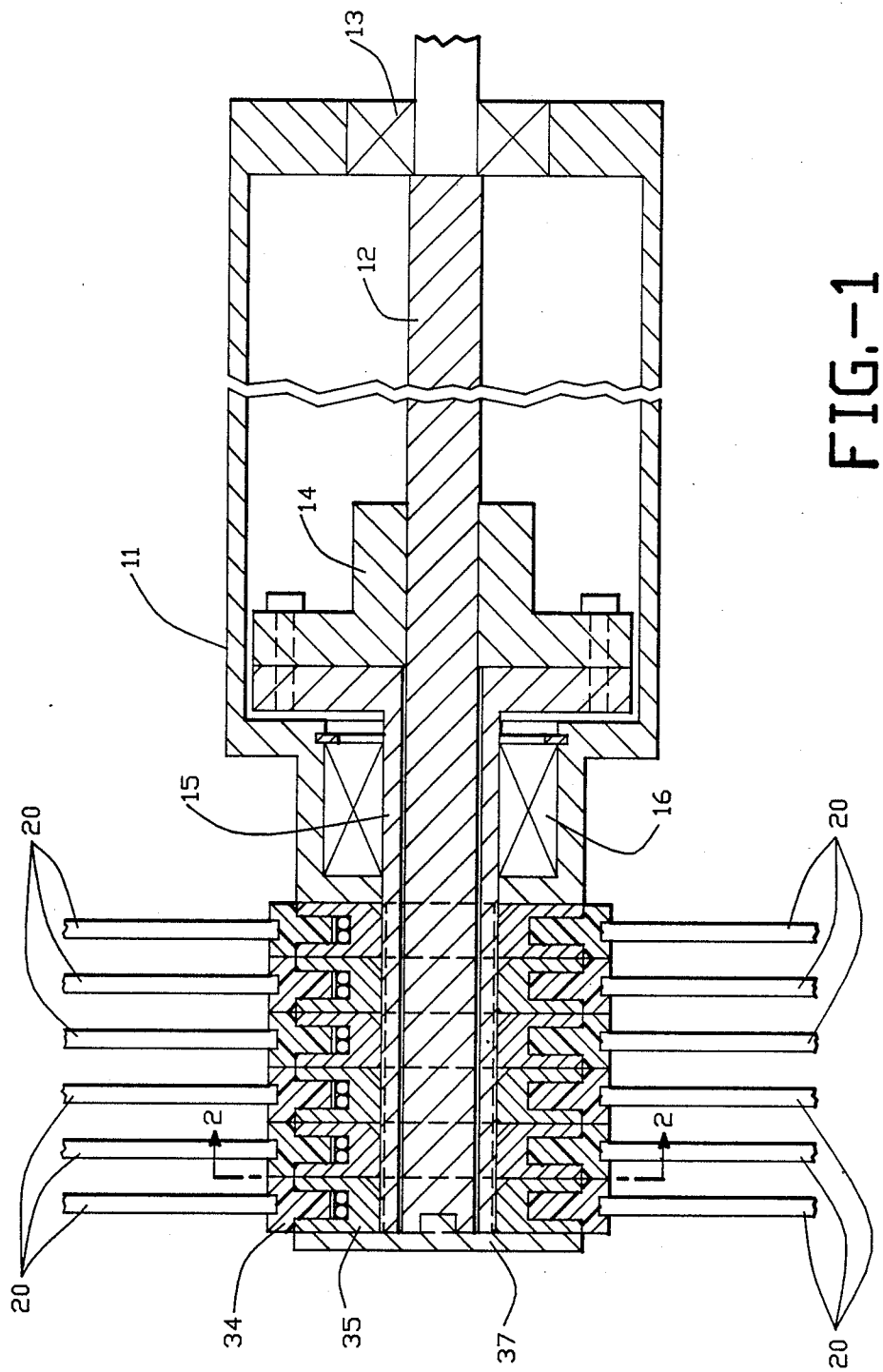
FIG. 1 is a sectional side view of a multi-disk clamp end effector embodying the present invention.
Figures 2, 3:
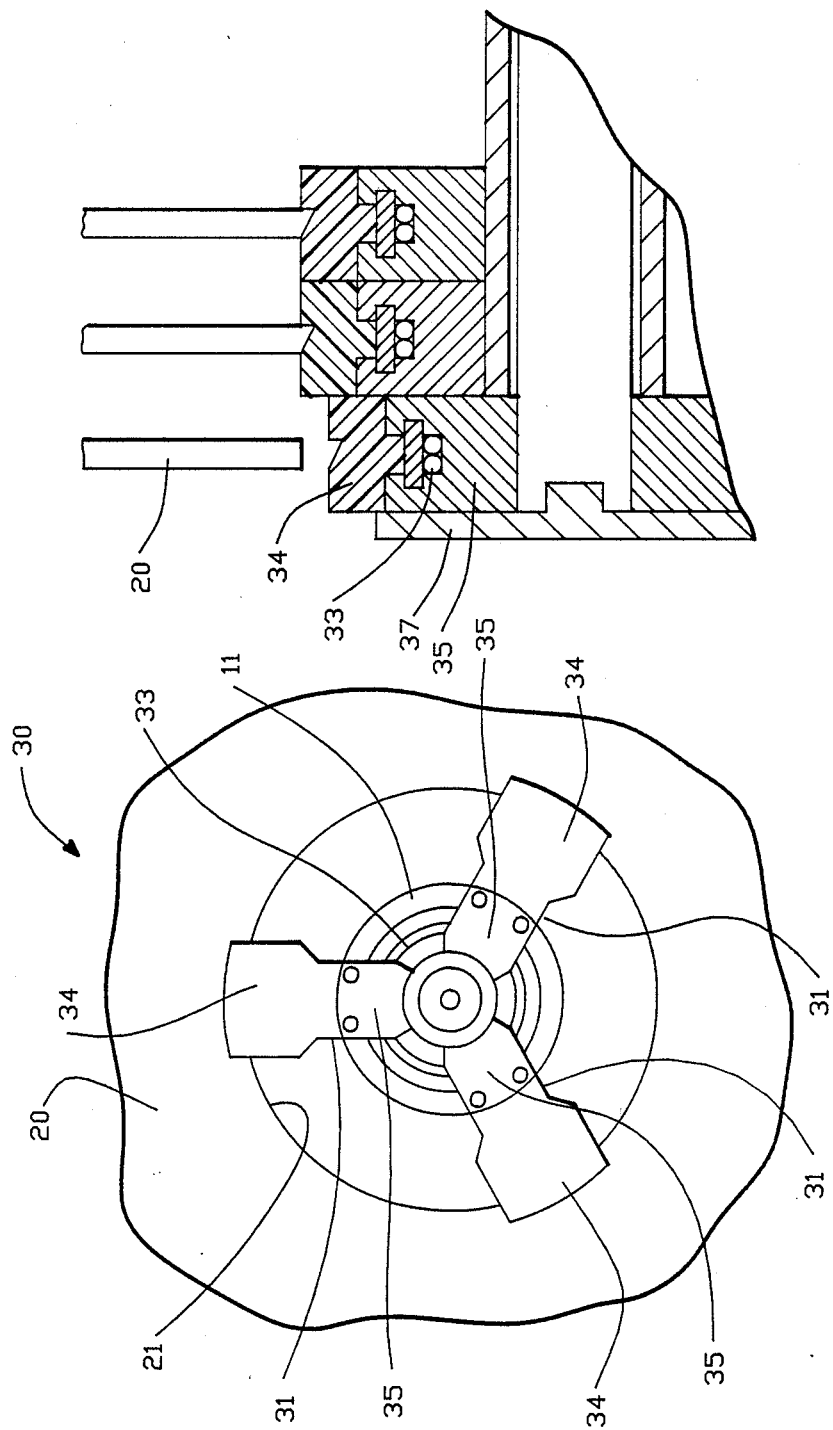
FIGS. 2 is another view of the end effector of FIG. 1 taken in the axial direction along the line 2-2 of FIG. 1.
FIG. 3 is a sectional side view of the end effector of FIG. 1 when the most forwardly positioned one of the disks carried thereby is about to be released.

With reference to FIGS. 1 and 2 which show a multi-disk clamp end effector embodying the present invention, numeral 11 indicates a supporting structure serving as a housing for a cylindrical shaft 12 which is helically threaded to serve as a helical gear and is rotatably supported by the supporting structure 11 through a bearing 13. Its back end on the right-hand side with reference to FIG. 1) is connected to a power source (not shown) for rotating it around its own axis and its front end sticks out of the supporting structure 11. Mounted around this shaft and contained inside the supporting structure 11 is a tubular nut 14 with its inner surface matchingly threaded so as to engage with the external surface of the shaft 12 to establish a motion-communicating relationship therewith and to move axially, or longitudinally, along the shaft 12 as the latter is rotated.

A tubular member 15 extending parallel to the shaft 12 and coaxially disposed therearound is attached to the front (on the left-hand side with Ref. to FIG. 1) of the tubular nut 14 and is also supported by the supporting structure 11 through a bushing 16. Its front part has a cylindrical external side surface with a circular cross-sectional shape for carrying a plurality of wafer-like disks 20 with a center hole, numeral 21 indicating the inner rim bordering the center hole. In order to securely attach the disks 20 onto the tubular member 15, each disk 20 is provided with a device hereinafter referred to as a holder 30. One of the primary functions of each holder 30 is to securely attach one of the disks 20 to the tubular member 15 when, for example, the disks 20 are being transported from one place to another. For this purpose, the holder 30 is comprised, as more clearly shown in FIG. 2, of three arms 31 which extend radially outward and are equally spaced angularly and an elastic rubber ring 33. Each arm 31 is comprised of an end piece 34 of a resin material with a groove on its external periphery to engagingly receive the inner rim 21 of the disk 20 to be attached and an inner piece 35 which is in direct contact with the cylindrical side surface of the tubular member 15. The end piece 34 and the inner piece 35 are securely joined together and the elastic ring 33 is passed through an opening left between these pieces 34 and 35 such that the contracting force of this elastic ring 33 serves to press the inner piece 35 against the tubular member 15, tending to pull the entire arm 31 inward. In other words, the ring 33 serves to apply centripetal forces on the three arms 31 of the holder 30. The disk 20 is thereby securely attached to the tubular member 15 for the purpose of transportation.

As shown in FIG. 1, a plurality of disks 20 are carried by the end effector of the present invention, each secured similarly to the outer surface of the tubular member 15 and maintaining parallel relationships among them between the front end of the supporting structure 11 and a front end cap 37 attached to the front end surface of the shaft 12. The front end cap 37 is circular and smaller than the center hole of the disks 20. When it is desired to release one of the disks 20 to be deposited at a desired position, The shaft 12 is rotated to gradually move the cylindrical nut 14 and hence the tubular member 15 backward. As the front end of the tubular member 15 is withdrawn by the thickness of the holder 30 from its fully extended position depicted in FIG. 1, the most forwardly positioned holder 30 loses its support from inside to resist the centripetal forces exerted thereon by the elastic ring 33 and allows its arms 31 to move inward until the inner pieces 35 come into contact with the shaft 12 which is rotatable around its own axis but is not slidable in the longitudinal direction as shown in FIG. 3 which depicts this situation. The radial distance between the external surfaces of the tubular member 15 and the shaft 12, that is, the distance by which the arms 31 of the holder 30 move inward is greater than the disk-receiving grooves formed on the end pieces 34. Thus, the inner rim 21 of the disk 20 becomes completely free from the holder 30 and the disk 20 is ready to be released. From the situation depicted in FIG. 3, if the shaft 12 is further rotated and the tubular member 15 is further withdrawn by the disk thickness, the second disk is similarly freed and released but all the other disks 20 still on the end effector remain securely attached to the tubular member 15 in the meantime.

Loading of disks onto the end effector shown above can be effected in the reverse order by moving the tubular member 15 forward. The front end surface of the tubular member 15 is rounded at the external edge and the backward edges of the inner pieces 35 of the holder are also rounded or sloped as shown in FIG. 1. As the tubular member 15 is moved in the forward direction, these rounded surfaces engage each other and the forward motion of the tubular member 15 is translated into radially outward motion of the arms 31 of the holder 30 at the position of the front end of the tubular member 15 Outwardly moving end pieces 34 thereby receive the inner rim 21 of a disk 20 to securely attach the latter thereonto.

The foregoing description of a preferred embodiment of the invention has been presented for purposes of illustration and description. It is not intended to be exhaustive or to limit the invention to the precise form disclosed and many modifications and variations are possible in light of the above teaching. For example, the number of arms per holder is not limited to three, nor is the number of disks to be carried limited by the illustration in FIG. 1 and 3. Any modifications and variations that may be apparent to a person skilled in the art are included within the scope of this invention.

What is claimed is:

1. A multi-disk clamp end effector for loading and sequentially unloading a plurality of disks, comprising
a supporting structure,
a tubular member slidably supported by said supporting structure, said tubular member having an external side surface and being longitudinally slidably with respect to said supporting structure, and
a plurality of holder means for removably securing disks individually to said tubular member, each of said holder means being disposed around said tubular member and attached to an annular disk and centripetally pressing said side surface of said tubular member, each of said holder means including an elastic ring disposed around said tubular member and a plurality of arms extending radially from said tubular member, each of said arms having an end piece securely attachable to an inner rim of said annular disk and an inner piece securely attached to said end piece, said elastic ring applying a centripetal force to press said inner piece to said external side surface of said tubular member.

2. The end effector of claim 1 wherein each of elastic ring passes between said end piece and said inner piece of each of said holder means.

3. The end effector of claim 1 wherein each of said holder means has three evenly spaced arms.

4. The end effector of claim 1 wherein said end pieces are made of a resin material.

5. The end effector of claim 1 further comprising a shaft rotatably supported by said supporting structure, said shaft and said tubular member being in motion-communicating relationship.

6. The end effector of claim 5 wherein said shaft penetrates said tubular member.

7. The end effector of claim 1 wherein said side surface is cylindrical with a circular cross-sectional shape.

8. The end effector of claim 6 wherein said shaft is cylindrical and is helically threaded to serve as helical gear and wherein said tubular member is securely attached to a tubular nut with a threaded internal surface which engages with said shaft such that a rotary motion of said shaft causes said tubular member to slide longitudinally.

9. The end effector of claim 1 wherein said tubular member has a sloped front surface and said holder means have an at least partially sloped inner surface such that said tubular member can easily penetrate and thereby radially displace said holder means.

* * * * *